(12) United States Patent
Chan et al.

(10) Patent No.: US 8,148,629 B2
(45) Date of Patent: *Apr. 3, 2012

(54) METHOD AND STRUCTURE FOR HYDROGENATION OF POROUS MONOCRYSTALLINE SILICON SUBSTRATES

(75) Inventors: Yick Chuen Chan, Wanchai (HK); Nathan W. Cheung, Wanchai (HK); Chung Chan, Wanchai (HK)

(73) Assignee: Silicon China (HK) Limited, Kowloon (HK)

( * ) Notice: Subject to any disclaimer, the term of this patent is extended or adjusted under 35 U.S.C. 154(b) by 716 days.

This patent is subject to a terminal disclaimer.

(21) Appl. No.: 11/852,823

(22) Filed: Sep. 10, 2007

(65) Prior Publication Data

US 2008/0105301 A1    May 8, 2008

Related U.S. Application Data

(60) Provisional application No. 60/825,262, filed on Sep. 11, 2006, provisional application No. 60/951,472, filed on Jul. 24, 2007.

(51) Int. Cl.
*H01L 31/00* (2006.01)
*B05D 5/12* (2006.01)

(52) U.S. Cl. .......................... 136/256; 427/74

(58) Field of Classification Search .................. 136/256; 427/74

See application file for complete search history.

(56) References Cited

U.S. PATENT DOCUMENTS

| | | | |
|---|---|---|---|
| 4,419,650 A | 12/1983 | John | |
| 4,554,727 A * | 11/1985 | Deckman et al. | 438/71 |
| 6,506,622 B1 | 1/2003 | Shiozaki | |
| 6,597,039 B2 * | 7/2003 | Ohmi et al. | 257/347 |
| 6,806,171 B1 * | 10/2004 | Ulyashin et al. | 438/492 |
| 2003/0017712 A1 * | 1/2003 | Brendel | 438/758 |
| 2004/0253794 A1 | 12/2004 | Faris | |
| 2005/0022863 A1 | 2/2005 | Agostinelli et al. | |
| 2006/0024442 A1 | 2/2006 | Ovshinsky | |
| 2006/0110618 A1 | 5/2006 | Manivannan et al. | |
| 2006/0145326 A1 | 7/2006 | Tran | |

OTHER PUBLICATIONS

Rinke, T.J. et al., "Quasi-monocrystalline silicon for thin-film devices", May 5, 1999, Appl. Phys. A 68, pp. 705-707.*
Landis Geoffrey A., "A Light-Trapping Solar Cell Coverglass," IEEE Photovoltaic Specialists Conference, Kissimmee, FL, May 21-25, 1990, vol. 2, pp. 1304-1307.

* cited by examiner

*Primary Examiner* — Basia Ridley
*Assistant Examiner* — Tamir Ayad
(74) *Attorney, Agent, or Firm* — Ella Cheong Hong Kong; Margaret Burke; Sam Yip

(57) ABSTRACT

A photovoltaic device and related methods of manufacture. The device has a support substrate having a support surface region. The device has a thickness of crystalline material characterized by a plurality of worm hole structures therein overlying the support surface region of the support substrate. The worm hole structures are characterized by a density distribution. The one or more worm hole structures have respective surface regions. In a specific embodiment, the thickness of crystalline material has an upper surface region. The device has a passivation material overlying the surface regions to cause a reduction of a electron-hole recombination process. A glue layer is provided between the support surface region and the thickness of crystalline material. A textured surface region formed overlying from the upper surface region of the thickness of crystalline material.

36 Claims, 17 Drawing Sheets

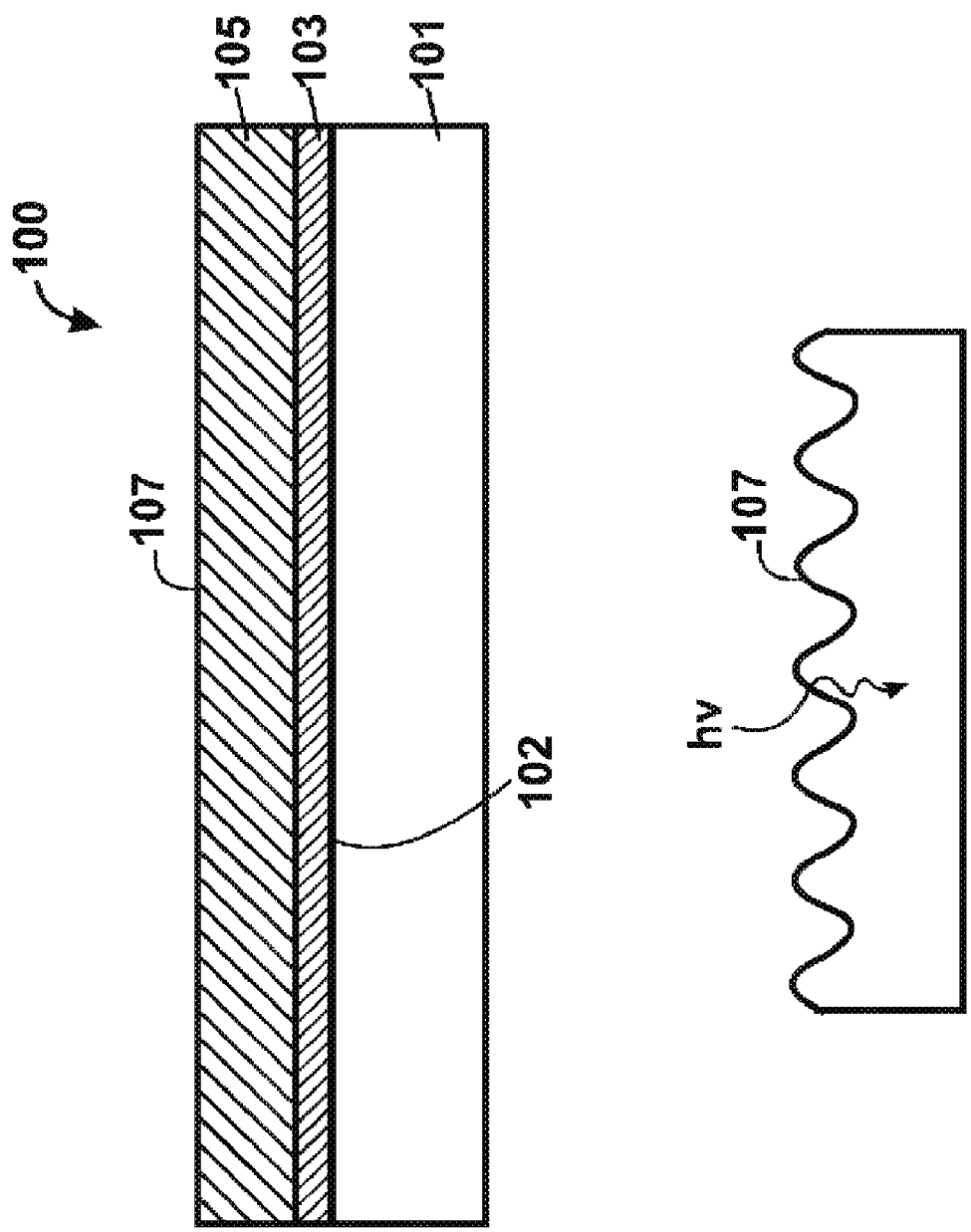

METHOD AND STRUCTURE FOR HYDROGENATION OF POROUS MONOCRYSTALLINE SILICON SUBSTRATES

CROSS-REFERENCES TO RELATED APPLICATIONS

This application claims priority to U.S. Provisional Application No. 60/825,262, filed Sep. 11, 2006, and to U.S. Provisional Application No. 60/951,472, filed Jul. 24, 2007, both of which are incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to solar energy techniques. In particular, the present invention provides a method and resulting device fabricated from a hydrogen separation process using a crystalline porous material suitable for photovoltaic applications. More particularly, the present invention provides a method and resulting device for manufacturing the photovoltaic regions within the single crystal porous material on a substrate member. Such substrate member can be a support member, such as a low grade polysilicon plate, metal plate, glass plate, a combination of these, or the like. Merely by way of example, the invention has been applied to solar panels, commonly termed modules, but it would be recognized that the invention has a much broader range of applicability.

Greenhouse gases are evolving at a rapid rate, leading to global warming. As the population of the world increases rapidly to over six billion people, there has been an equally large consumption of energy resources, which leads to additional greenhouse gases. Often times, conventional energy comes from fossil fuels, including oil and coal, hydroelectric plants, nuclear sources, and others. As merely an example, further increases in oil consumption have been projected. Developing nations such as China and India account for most of the increase, although the United States remains the biggest consumer of energy resources. In the U.S., almost every aspect of our daily lives depends, in part, on oil. These aspects include driving to and from work, heating our homes, and operating large machines for construction and the like.

Oil is becoming increasingly scarce. As time further progresses, an era of "cheap" and plentiful oil is coming to an end. Oil will eventually disappear, which could possibly take us back to primitive times. Accordingly, other and alternative sources of energy have been developed. Modern day society has also relied upon other very useful sources of energy. Such other sources of energy include hydroelectric, nuclear, and the like to provide our electricity needs. Such electricity needs range from lighting our buildings and homes to operating computer systems and other equipment and the like. Most of our conventional electricity requirements for these home and business uses come from turbines run on coal or other forms of fossil fuel, nuclear power generation plants, and hydroelectric plants, as well as other forms of renewable energy. A popular form of renewable energy has been solar, which is derived from our sun.

Our sun is essential for solar energy. Solar energy possesses many desired characteristics. As noted above, solar energy is renewable. Solar energy is also abundant and clean. Conventional technologies developed often capture solar energy, concentrate it, store it, and convert it into other useful forms of energy. A popular example of one of these technologies includes solar panels. Such solar panels include solar cells that are often made using silicon bearing materials, such as polysilicon or single crystal silicon. An example of such solar cells can be manufactured by various companies that span our globe. Such companies include, among others, Q Cells in Germany, Sun Power Corporation in California, Suntech of China, and Sharp in Japan. Other companies include BP Solar and others.

Unfortunately, solar cells still have limitations although solar panels have been used successfully for certain applications. As an example, solar cells are often costly. Solar cells are often composed of silicon bearing wafer materials, which are difficult to manufacture efficiently on a large scale. Availability of solar cells made of silicon is also somewhat scarce with limited silicon manufacturing capacities. These and other limitations are described throughout the present specification, and may be described in more detail below.

From the above, it is seen that techniques for improving solar devices is highly desirable.

BRIEF SUMMARY OF THE INVENTION

According to the present invention, techniques related to solar energy are provided. In particular, the present invention provides a method and resulting device fabricated from a hydrogen separation process using a crystalline porous material suitable for photovoltaic applications. More particularly, the present invention provides a method and resulting device for manufacturing the photovoltaic regions within the single crystal porous material on a substrate member. Such substrate member can be a support member, such as a low grade polysilicon plate, metal plate, glass plate, a combination of these, or the like. Merely by way of example, the invention has been applied to solar panels, commonly termed modules, but it would be recognized that the invention has a much broader range of applicability.

In a specific embodiment, the present invention provides a method for fabricating a photovoltaic material. The method includes providing a semiconductor substrate, e.g., single crystal silicon, silicon germanium, Group II/V, Group III/V materials. In a specific embodiment, the method includes forming a crystalline material characterized by a plurality of worm hole structures therein overlying the semiconductor substrate. In a specific embodiment, the worm hole structures are characterized by a density distribution from a surface region of the crystalline material to a defined depth within a z-direction of the surface region to form a thickness of material to be detached. The method includes subjecting the crystalline material to a hydrogen plasma species to occupy at least one or more of the worm hole structures therein of the crystalline material within a vicinity of an interface between the thickness of material and a remaining portion of the semiconductor substrate. The method includes providing a glue layer overlying a surface region of the crystalline material. In a specific embodiment, the method joins the surface region of the crystalline material via the glue layer to a support substrate. In a preferred embodiment, the method includes delaminating a portion of the crystalline material from the semiconductor substrate, while the portion of the thickness of crystalline material remains attached to the support substrate, to cause formation of a textured surface region from the portion of the thickness of crystalline material. The method includes using the overlying thickness of crystalline material having the plurality of worm hole structures on the support substrate for a photovoltaic application.

In an alternative specific embodiment, the present invention provides an alternative method for fabricating a photovoltaic material. The method includes providing a semiconductor substrate, e.g., single crystal silicon, silicon germanium, Group II/VI, Group III/V materials. In a specific embodiment, the method includes forming a crystalline material characterized by a plurality of worm hole structures therein overlying the semiconductor substrate. In a specific embodiment, the worm hole structures are characterized by a density distribution from a surface region of the crystalline material to a defined depth within a z-direction of the surface region to form a thickness of material to be detached. In a preferred embodiment, the one or more worm hole structures have respective surface regions, e.g., inner surface regions. The method includes subjecting the crystalline material to a hydrogen plasma species to occupy at least one or more of the worm hole structures therein of the crystalline material within a vicinity of an interface between the thickness of material and a remaining portion of the semiconductor substrate. The method includes providing a glue layer overlying a surface region of the crystalline material. In a specific embodiment, the method joins the surface region of the crystalline material via the glue layer to a support substrate. In a preferred embodiment, the method includes delaminating a portion of the crystalline material from the semiconductor substrate, while the portion of the thickness of crystalline material remains attached to the support substrate, to cause formation of a textured surface region from the portion of the thickness of crystalline material. The method includes using the overlying thickness of crystalline material having the plurality of worm hole structures on the support substrate for a photovoltaic application. In a preferred embodiment, the method includes passivating the surface regions during the subjecting of the hydrogen plasma species to reduce a electron-hole recombination process.

In yet an alternative specific embodiment, the invention provides a photovoltaic device. The device has a support substrate having a support surface region. The device has a thickness of crystalline material characterized by a plurality of worm hole structures therein overlying the support surface region of the support substrate. The worm hole structures are characterized by a density distribution. The one or more worm hole structures have respective surface regions. In a specific embodiment, the thickness of crystalline material has an upper surface region. The device has a passivation material overlying the surface regions to cause a reduction of a electron-hole recombination process. A glue layer is provided between the support surface region and the thickness of crystalline material. A textured surface region formed overlying from the upper surface region of the thickness of crystalline material.

Many benefits are achieved by way of the present invention over conventional techniques. For example, the present technique provides an easy to use process that relies upon conventional technology such as silicon materials, although other materials can also be used. Additionally, the method provides a process that is compatible with conventional process technology without substantial modifications to conventional equipment and processes. Preferably, the invention provides for an improved solar cell, which is less costly and easy to handle. Such solar cell uses a hydrogen co-implant to form a thin layer of photovoltaic material. Since the layers are very thin, multiple layers of photovoltaic regions can be formed from a single conventional single crystal silicon or other like material wafer. In a preferred embodiment, the present thin layer removed by hydrogen implant and thermal treatment can be provided on a low grade substrate material, which will serve as a support member. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 1 is a simplified side-view diagram of a photovoltaic device according to an embodiment of the present invention;

DETAILED DESCRIPTION OF THE INVENTION

Figure 1A:
FIG. 1A is a detailed diagram of a crystalline material characterized by worm hole structures according to an embodiment of the present invention.

According to the present invention, techniques related to solar energy are provided. In particular, the present invention provides a method and resulting device fabricated from a hydrogen separation process using a crystalline porous material suitable for photovoltaic applications. More particularly, the present invention provides a method and resulting device for manufacturing the photovoltaic regions within the single crystal porous material on a substrate member. Such substrate member can be a support member, such as a low grade polysilicon plate, metal plate, glass plate, a combination of these, or the like. Merely by way of example, the invention has been applied to solar panels, commonly termed modules, but it would be recognized that the invention has a much broader range of applicability.

FIG. 1 is a simplified side-view diagram of a photovoltaic device according to an embodiment of the present invention. This diagram is merely an example, which should not unduly limit the scope of the claims herein. One of ordinary skill in the art would recognize many variations, modifications, and alternatives. As shown is a based material for a photovoltaic device 100. The device has a support substrate 101 having a support surface 102 region. In a specific embodiment, the support substrate can be a metal, dielectric, or semiconductor, or any combination of these. The support substrate can also be an organic polymer material, composite, or other structural entity according to a specific embodiment. As merely an example, the metal can be stainless steel, aluminum, molybdenum, titanium, or silicides, including oxides of these metals. As merely an example, the dielectric material can be glass, quartz, organic polymer, or ceramics. As merely an example, the semiconductor can be silicon, including amorphous silicon, polysilicon, solar-grade silicon, and other forms of silicon. Of course, there can be other variations, modifications, and alternatives.

In a specific embodiment, the device has a thickness of crystalline material 105 characterized by a plurality of worm hole structures therein overlying the support surface region of the support substrate. In a specific embodiment, the crystalline material is a semiconductor material, which will serve as a base material for a photovoltaic device. As an example, the material can be single crystal silicon, silicon germanium, gallium arsenide, Group II/VI, or Group III/V materials. Alternatively, the material can be composites, layered, graded, or others, depending upon the specific embodiment. Of course, there can be other variations, modifications, and alternatives.

In a specific embodiment, the worm hole structures are characterized by a density distribution. In a specific embodiment, the pores per volume density is higher near surface region 107 than at interface region toward the surface region 102 of the support substrate. Of course, there can be variations, modifications, and alternatives.

Figure 1B:
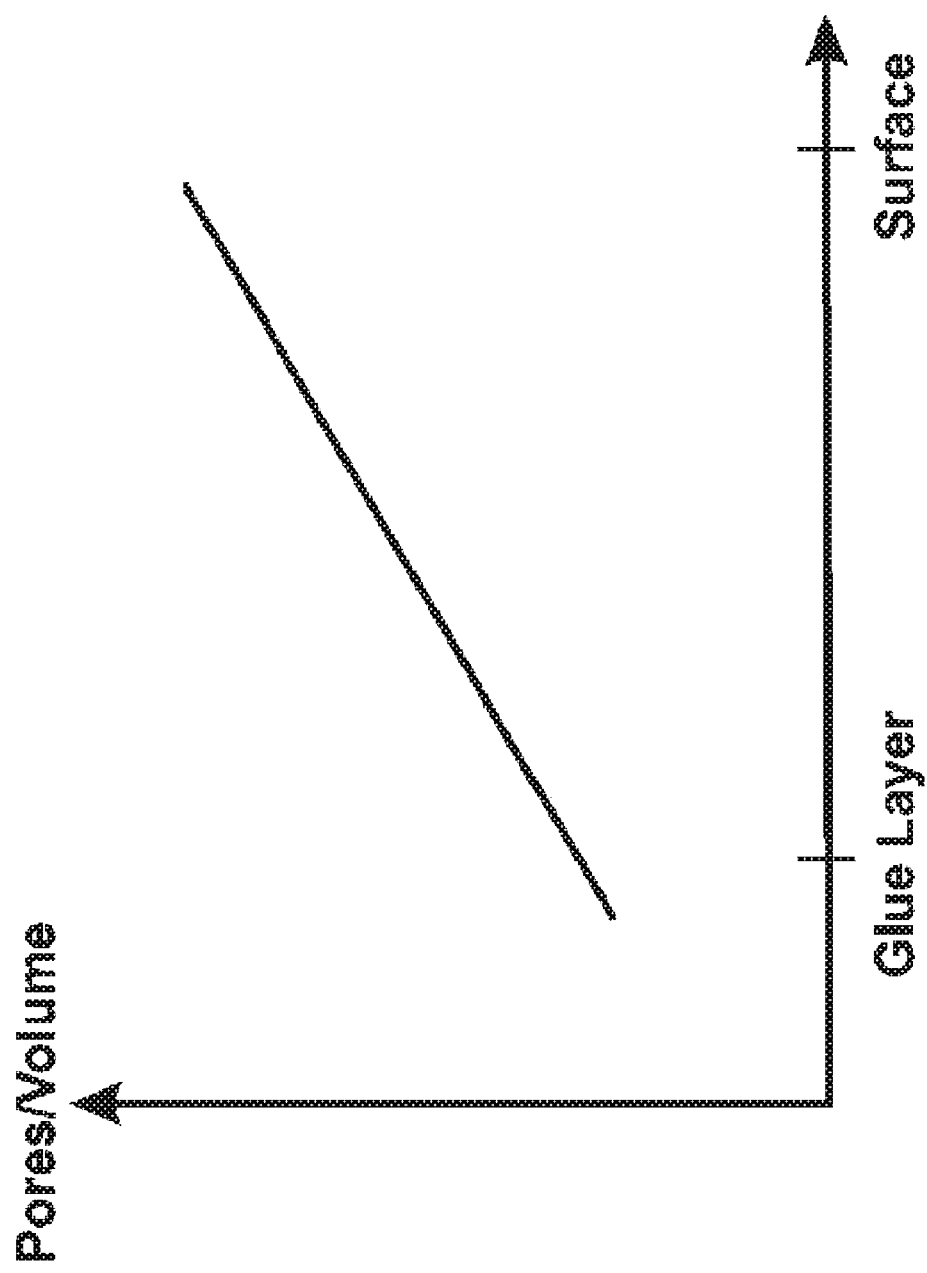
FIG. 1B is a simplified diagram of a plot illustrating pore density distribution of a thickness of crystalline material according to an embodiment of the present invention.
Figure 2:
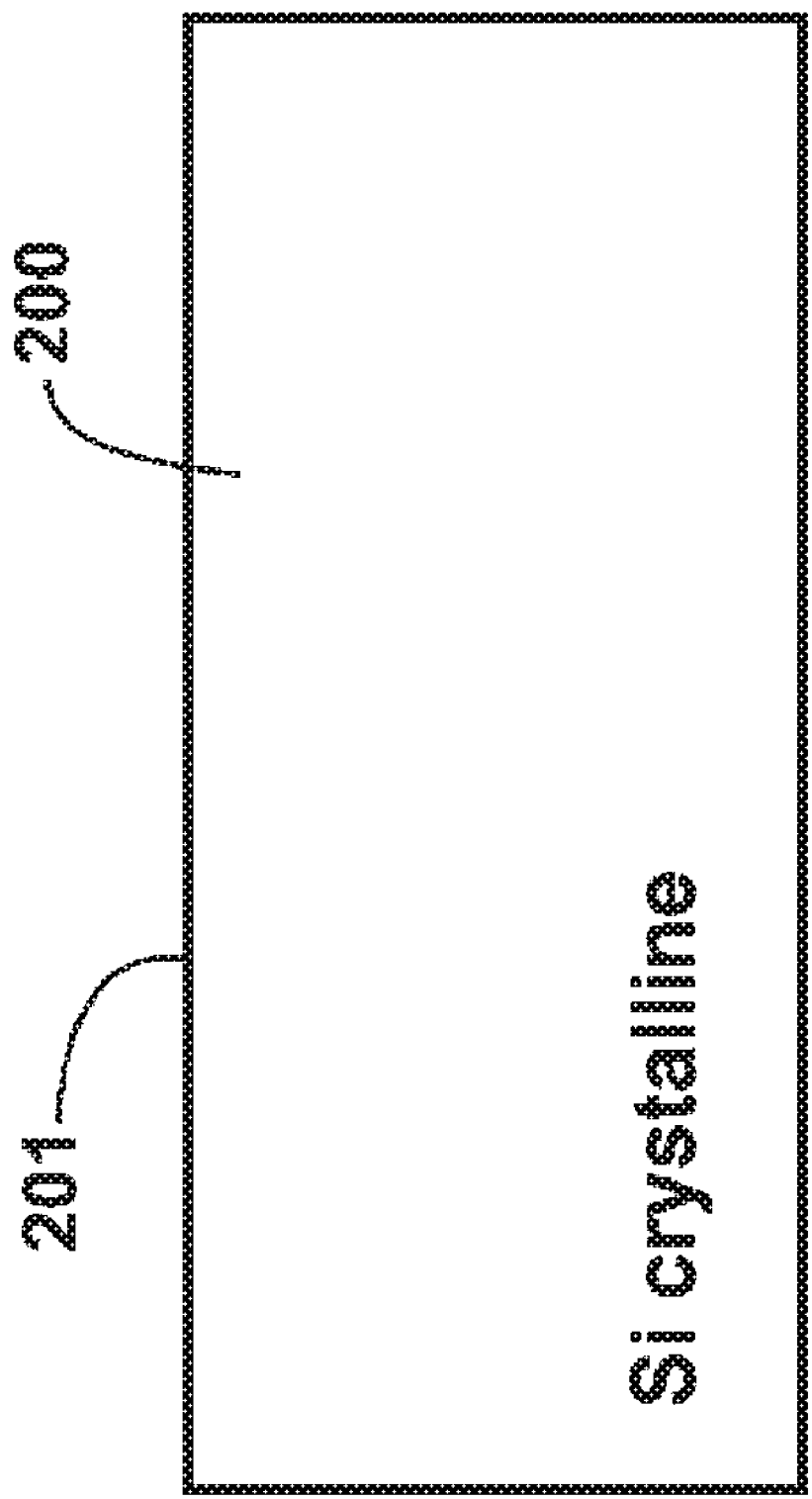
FIGS. 2 through 7 are simplified diagrams illustrating a method for fabricating a photovoltaic material according to an embodiment of the present invention.

As merely an example, the worm hole structures can have one or more dimension characteristics as illustrated in FIG. 1A. That is, the hole structures comprise a characteristic dimension ranging from about 1 nanometer to about 1 micron according to embodiments of the present invention. Additionally, the density distribution ranges from about $10/cm^3$ to about $10^{20}/cm^3$ according to embodiments of the present invention. In a specific embodiment, the density distribution ranges from a first density value at a vicinity of the support structure and a second density at a vicinity of the upper surface region, as illustrated by FIG. 1B. As shown, the vertical axis represents density in pores per volume and the horizontal axis represents a spatial dimension from the glue layer to the surface of the crystalline material according to a specific embodiment. Alternatively, the density distribution ranges from $10/cm^3$ to $10^{10}/cm^3$ at a vicinity of the support structure and $10^{10}/cm^3$ to $10^{20}/cm^3$ at a vicinity of the upper surface region according to a specific embodiment. As shown, the pores per volume increase from the interface region, which can be the glue layer, to the surface region according to a specific embodiment. Of course, there can be variations, modifications, and alternatives.

In a preferred embodiment, the device has a passivation material overlying the surface regions to cause a reduction of a electron-hole recombination process. In a specific embodiment, the crystalline material is single crystal silicon. Such single crystal silicon includes silicon molecules. Such molecules may be terminated using hydrogen or other species according to a specific embodiment. In a preferred embodiment, the termination causes passivation of the internal surfaces of the worm hole structures, which lead to a reduction of electron-hole recombination or other influences. In other embodiments, other species can be used to passivate the surface region of the worm hole structures. Of course, there can be other variations, modifications, and alternatives.

Referring again to FIG. 1, the device has a glue layer 103 provided between the support surface region and the thickness of crystalline material. In a specific embodiment, the glue layer is selected from spin on glass, an eutectic material, a polymer, or a metal layer. In a specific embodiment, the spin on glass is silicate or polysiloxane material, but can be others. In a specific embodiment, the eutectic material alloys are aluminum-silicon and indium-palladium, but can be others. In a specific embodiment, the polymer can be epoxy, which is organic in characteristic. Alternatively, the metal layer can be tungsten, tin or aluminum. Of course, there can be other variations, modifications, and alternatives.

In a specific embodiment, a textured surface region 107 is formed overlying from the upper surface region of the thickness of crystalline material. In a specific embodiment, the textured surface region has a roughness ranging from about 100 nanometers to about 10 microns. Depending upon the embodiment, the textured surface region is characterized by a surface roughness to facilitate capture of one or more photons being illuminated thereon. In other words, the textured surface region has a surface roughness of greater than about 100 nanometers to cause less than about 25% reflection from a total amount of irradiating in a wavelength ranging from about 0.1 micron to about 5 microns. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims. Further details of methods according to embodiments of the present invention are provided throughout the present specification and more particularly below.

In a specific embodiment, the present invention provides a method for fabricating a photovoltaic device that can be outlined as follows:

1. Provide a semiconductor substrate, e.g., single crystal silicon, silicon germanium, Group II/VI, Group III/V materials;
2. Form a crystalline material characterized by a plurality of worm hole structures therein overlying the semiconductor substrate
3. Subject the crystalline material to a hydrogen plasma species to occupy at least one or more of the worm hole structures therein of the crystalline material within a vicinity of an interface between the thickness of material and a remaining portion of the semiconductor substrate;
4. Provide a glue layer overlying a surface region of the crystalline material;
5. Join the surface region of the crystalline material via the glue layer to a support substrate;
6. Delaminate a portion of the crystalline material from the semiconductor substrate;
7. Maintain attachment of the portion of the thickness of crystalline material to the support substrate during step (6);
8. Cause formation of a textured surface region from the portion of the thickness of crystalline material;
9. Use the overlying thickness of crystalline material having the plurality of worm hole structures on the support substrate for a photovoltaic application;
10. Perform other steps, as desired.

The above sequence of steps provides a method for fabricating a crystalline worm hole structure for photovoltaic applications according to an embodiment of the present invention. As shown, the method uses a combination of steps including a way of forming the crystalline material, which will be detached according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 7 are simplified diagrams illustrating a method for fabricating a photovoltaic material according to an embodiment of the present invention. These diagrams are merely examples, which should not unduly limit the scope of the claims herein. One of ordinary skill in the art would recognize many variations, modifications, and alternatives.

In a specific embodiment, the present invention provides a method for fabricating a photovoltaic material. The method includes providing a semiconductor substrate 200. As an example, the material can be single crystal silicon, silicon germanium, gallium arsenide, Group II/VI, or Group III/V materials. Alternatively, the material can be composites, layered, graded, or others, depending upon the specific embodiment. Of course, there can be other variations, modifications, and alternatives.

Figure 3:
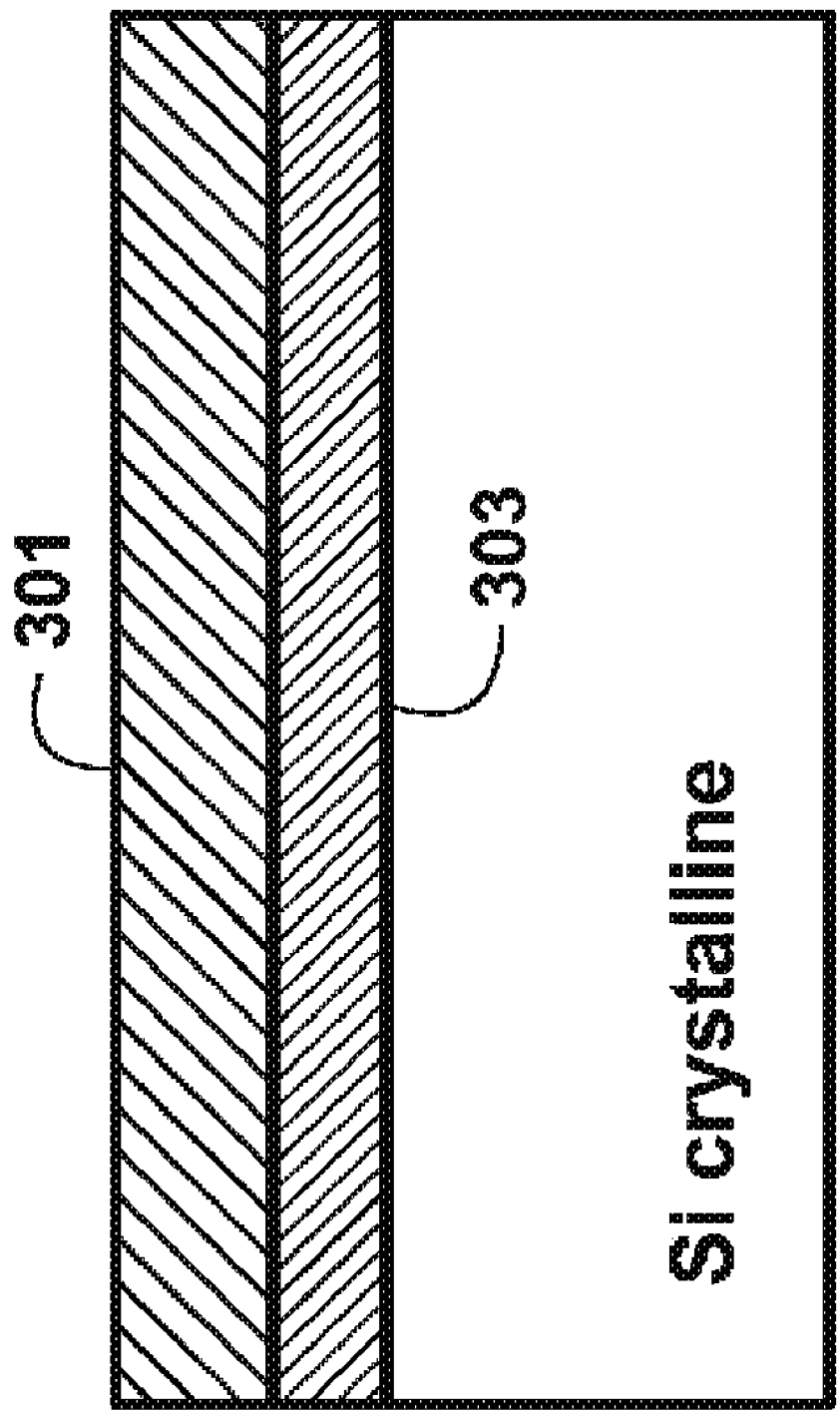

In a specific embodiment, the method includes forming a crystalline material characterized by a plurality of worm hole structures therein overlying the semiconductor substrate as illustrated in FIG. 3. In a specific embodiment, the method includes subjecting the surface region 201 of the semiconductor material to an electrochemical process to cause formation of a pores per volume density gradient ranging from a lower density at surface 301 to a higher density at interface region 303, which is a remaining portion of the semiconductor material. In a preferred embodiment, the semiconductor material is crystalline and/or like structure. Of course, there can be other variations, modifications, and alternatives.

As merely an example, the method uses an electrochemical etching process to cause formation of the worm hole structures. In a specific embodiment, the electrochemical etching processes uses a HF anodic attack chemistry. Such chemistry is provided using a bath of HF-containing solution according to a specific embodiment. A voltage of about tens of volts is provided between the crystalline material, which is used as a first electrode and a noble metal, which is a second electrode according to a specific embodiment. Pores per volume density of the wafer can be controlled by varying the applied current density. Switching the current density from high to low current enables the formation of a low-pore density surface and a high-pore density buried layer. The dimension of the pore, and therefore the pores per volume density, can also be controlled by varying the concentration of the HF-containing solution. Increasing the portion of HF in the solution results in smaller pore formations and higher pore densities. Alternatively, pore per volume density can further be controlled by the doping level of impurity inside the substrate material and the light illumination level during pore formation. Of course, there can be other variations, modifications, and alternatives.

In a specific embodiment, the worm hole structures are characterized by a density distribution from the surface region 301 of the crystalline material to a defined depth 303 within a z-direction of the surface region to form a thickness of material to be detached. In a specific embodiment, the worm hole structures are characterized by a density distribution. In a specific embodiment, the worm hole pore density is lower near the surface region than at the interface region. Of course, there can be variations, modifications, and alternatives.

As merely an example, the worm hole structures can have one or more dimension characteristics. That is, the hole structures comprise a characteristic dimension ranging from about 1 nanometer to about 1 micron according to embodiments of the present invention. Additionally, the density distribution ranges from about $10/cm^3$ to about $10^{20}/cm^3$ according to embodiments of the present invention. Of course, there can be variations, modifications, and alternatives.

Figure 4:
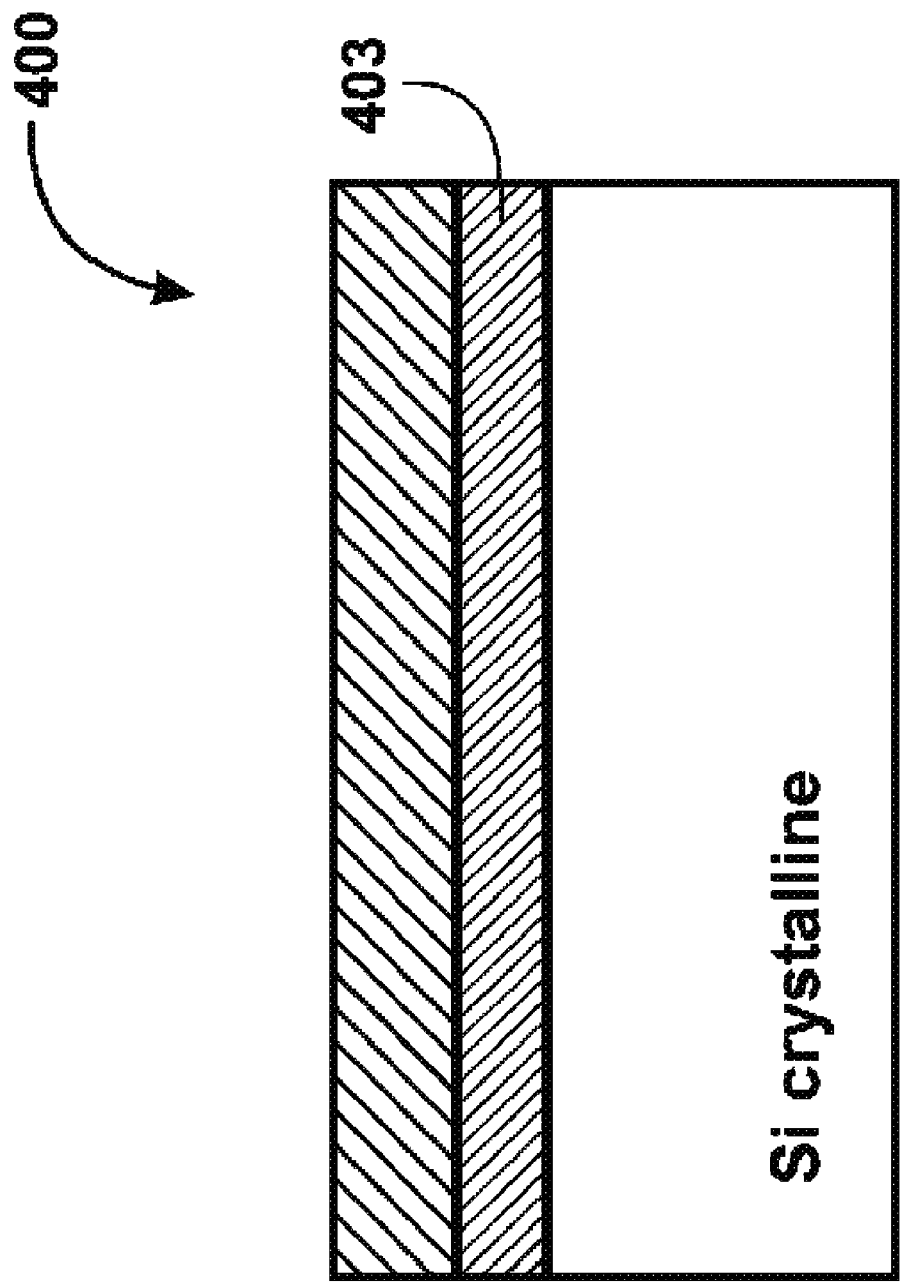

In a specific embodiment, the method includes subjecting 400 the crystalline material to a hydrogen plasma species as illustrated by FIG. 4. Such plasma treatment can be used to occupy at least one or more of the worm hole structures therein of the crystalline material within a vicinity of an interface between the thickness of material and a remaining portion of the semiconductor substrate according to a specific embodiment. A higher concentration of hydrogen species accumulates at region 403, which has a higher pores per volume density according to a specific embodiment. In a specific embodiment, the accumulation of hydrogen can range from a concentration of about $10^{18}/cm^3$ to about $10^{22}/cm^3$. In a preferred embodiment, the hydrogen concentration is about $10^{21}/cm^3$ and greater to add stress within region 403, which serves as a cleave region. Of course, there can be other variations, modifications, and alternatives.

Figure 5:
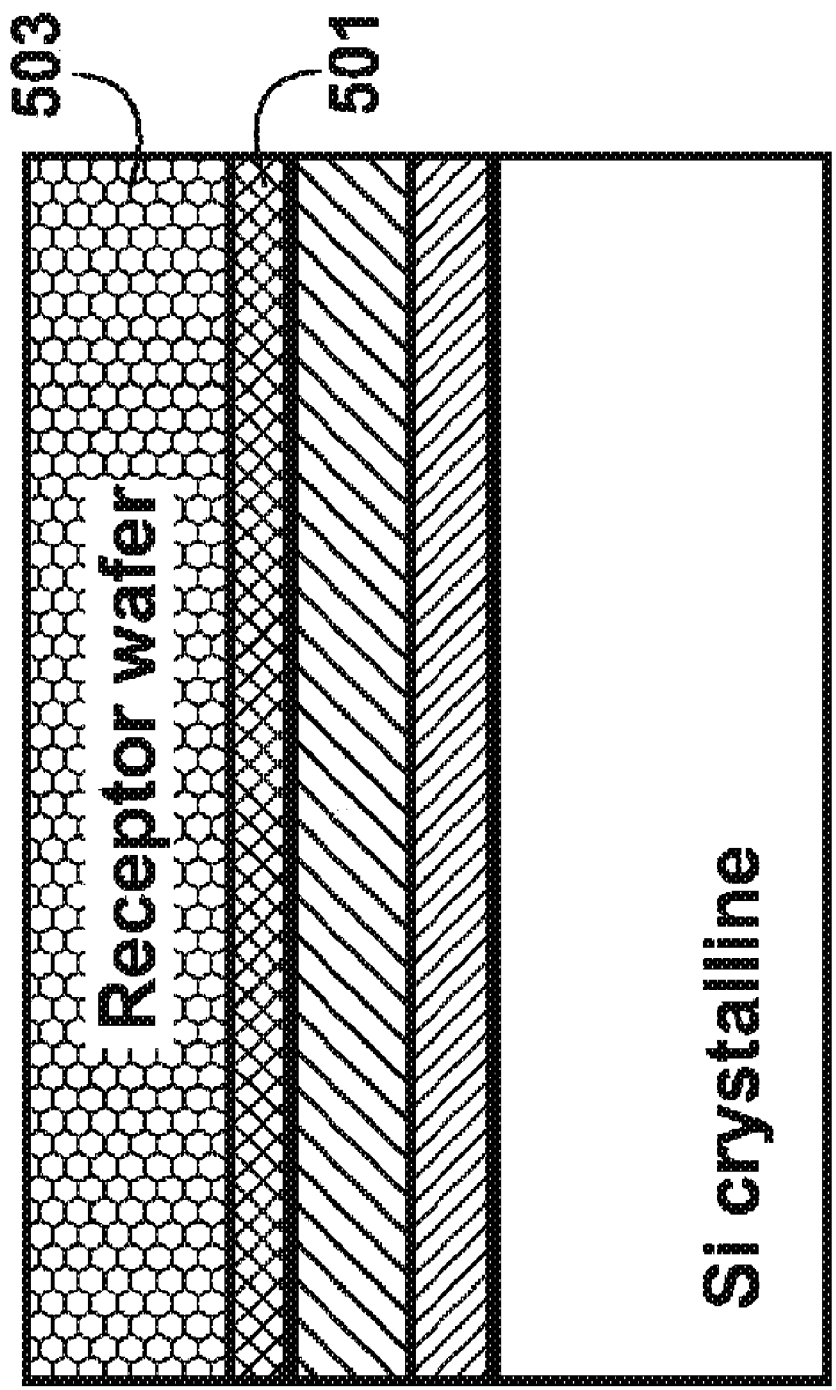

Referring to FIG. 5, the method includes providing a glue layer 501 overlying a surface region of the crystalline material. Depending upon the embodiment, the glue layer can be provided on a support member 503 or surface region of a rigid material. In a specific embodiment, the glue layer is selected from spin on glass, a eutectic material, a polymer, or a metal layer. In a specific embodiment, the spin on glass is silicate or polysiloxane material, but can be others. In a specific embodiment, the eutectic material alloys are aluminum-silicon and indium-palladium. In a specific embodiment, the polymer can be epoxy, which is organic in characteristic. Alternatively, the metal layer can be tungsten, tin or aluminum. Of course, there can be other variations, modifications, and alternatives.

In a specific embodiment, the method joins the surface region of the crystalline material via the glue layer to a support substrate 503. In a specific embodiment, the support substrate can be a metal, dielectric, or semiconductor, or any combination of these. The support substrate can also be an organic polymer material, composite, or other structural entity according to a specific embodiment. As merely an example, the metal can be stainless steel, aluminum, molydinum, titanium, or silicides, including oxides of these metals. As merely an example, the dielectric material can be glass, quartz, organic polymer, or ceramics. As merely an example, the semiconductor can be silicon, including amorphous silicon, polysilicon, metallurgical silicon, and other forms of silicon. Of course, there can be other variations, modifications, and alternatives.

Figure 6:
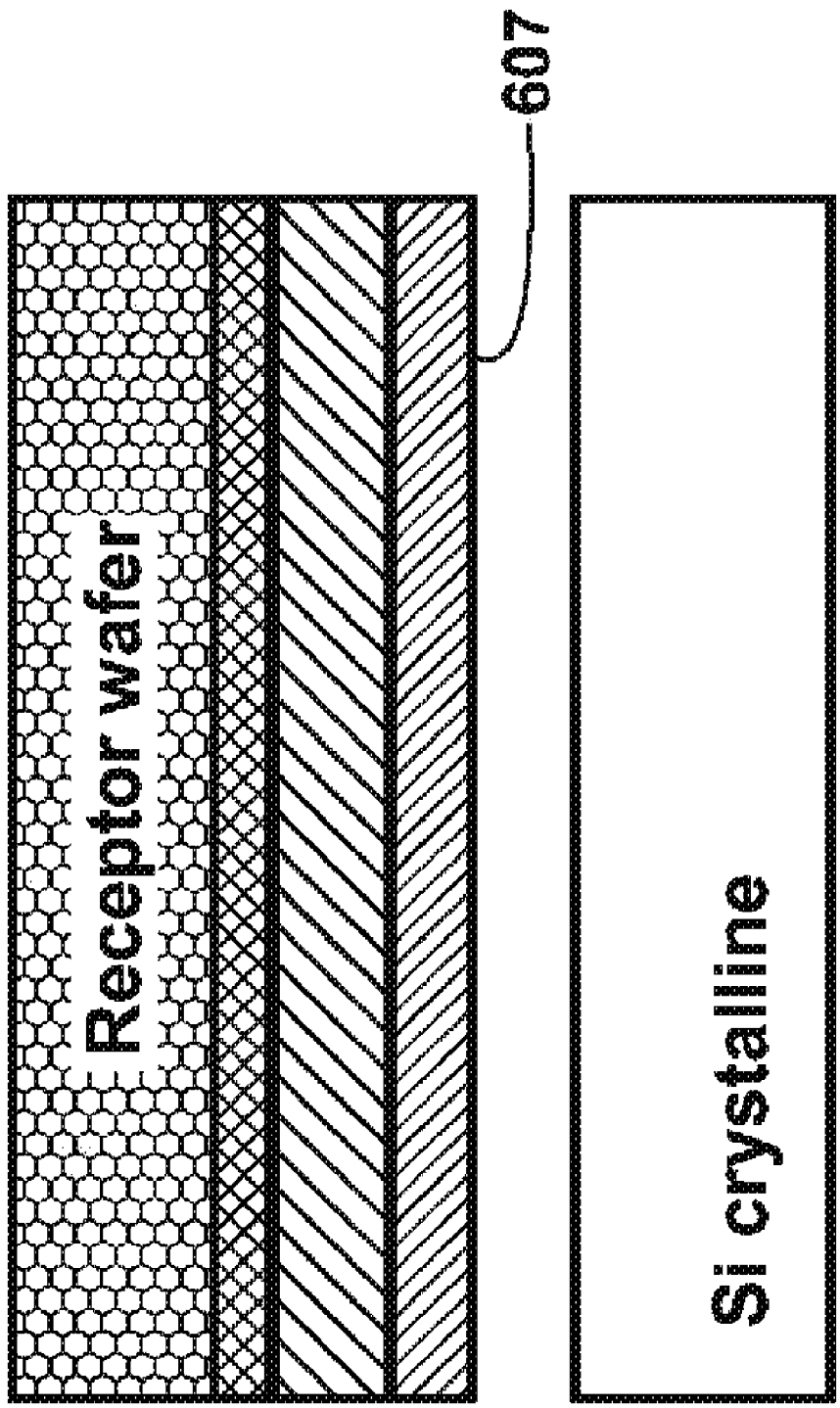

In a preferred embodiment, the method includes delaminating a portion of the crystalline material from the semiconductor substrate as illustrated in FIG. 6. In a specific embodiment, delamination occurs using thermal, chemical, mechanical, gravitational, electromagnetic, or other energy sources, including combinations of such sources. In a preferred embodiment, delamination occurs using thermal treatment by subjecting the bonded structure from 200 to 500 degrees Celsius for a period from 10 to 100 minutes to cause release at the cleave region from the remaining substrate portion, as shown. As shown, the delamination occurs while the portion of the thickness of crystalline material remains attached to the support substrate, to cause formation of a textured surface region from the portion of the thickness of crystalline material. Of course, there can be other variations, modifications, and alternatives.

In a specific embodiment, a textured surface region 607 is formed from a detached surface region of the thickness of crystalline material. As seen in FIG. 6, textured surface region 607 is a continuous layer of the wormhole-structured porous material. In a specific embodiment, the textured surface region has a roughness ranging from about 100 nanometers to about 10 microns. Depending upon the embodiment, the textured surface region is characterized by a surface roughness to facilitate capture of one or more photons being illuminated thereon. In other words, the textured surface region has a surface roughness of greater than about 100 nanometers to cause less than about 25% reflection from a total amount of irradiating in a wavelength ranging from about 0.1 micron to about 5 microns. Of course, there can be other variations, modifications, and alternatives.

Figure 7:
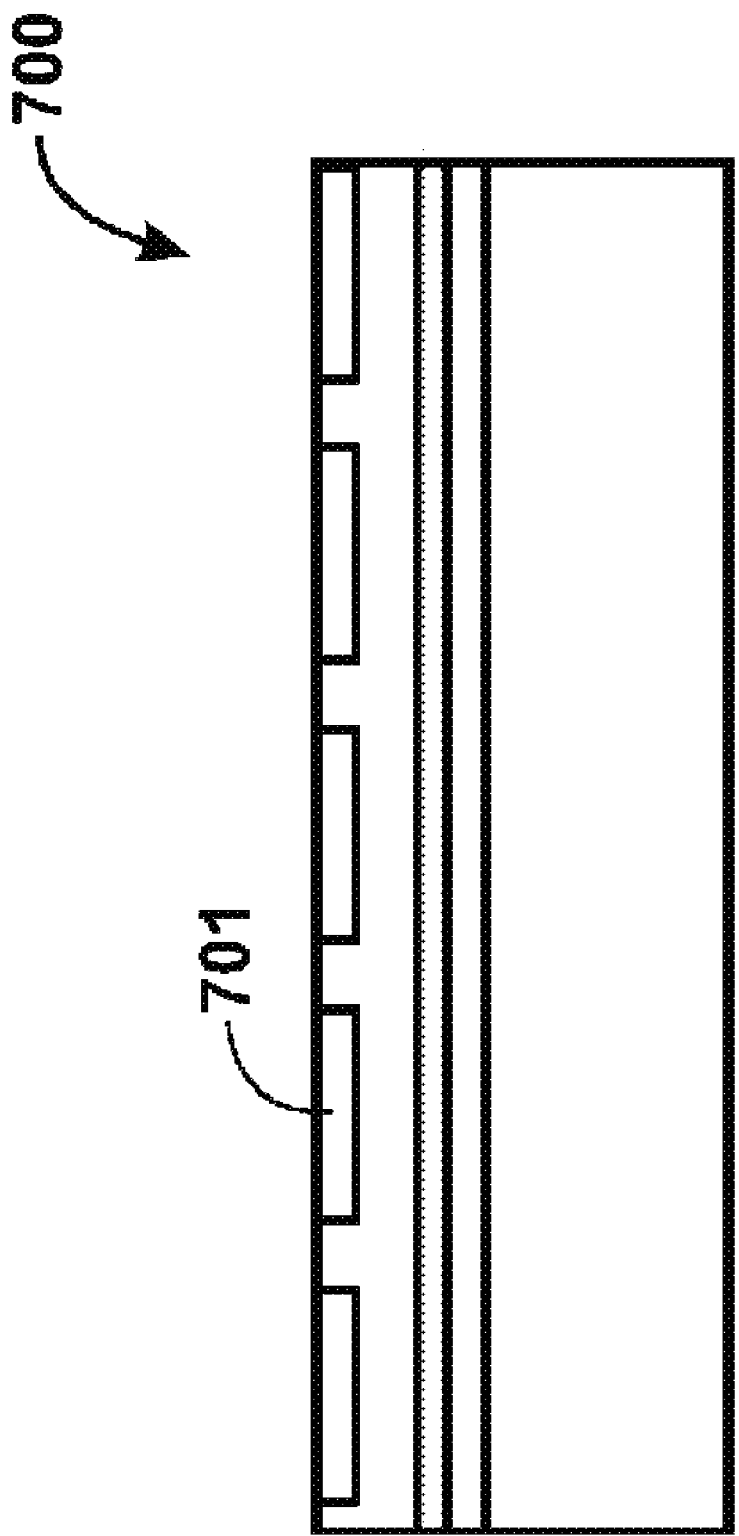
Figure 8:
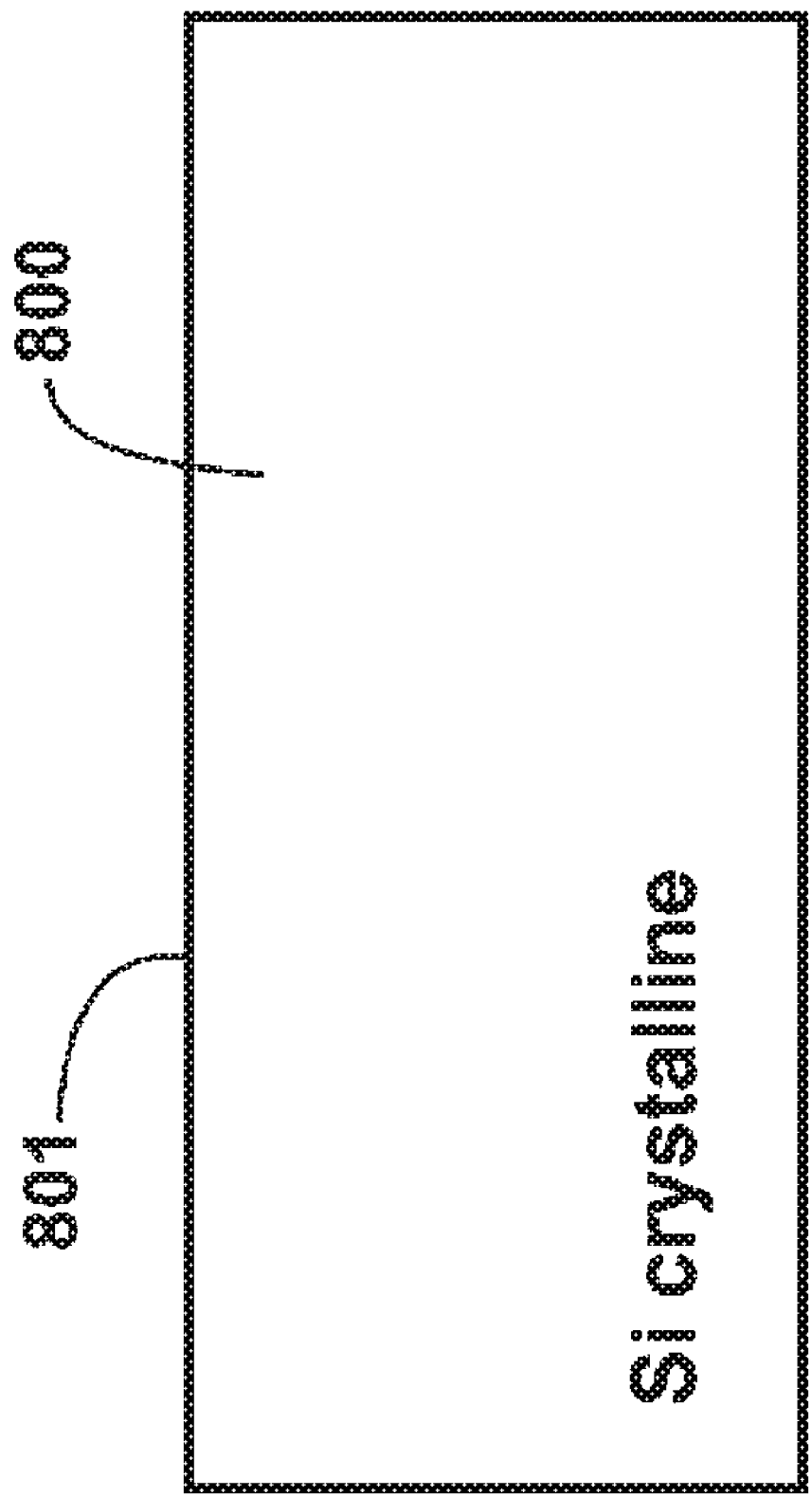
FIGS. 8 through 13 are simplified diagrams illustrating a method for fabricating a photovoltaic material according to an embodiment of the present invention.

Referring to FIG. 7, the method includes using the overlying thickness of crystalline material having the plurality of worm hole structures on the support substrate for a photovoltaic application according to a specific embodiment. In a specific embodiment, the method includes forming one or more photovoltaic devices 701 on a portion of the crystalline material. Depending upon the embodiment, such devices can be formed using implantation/diffusion and other techniques for introducing impurities into the crystalline material. In a preferred embodiment, the device also includes metallization for electrodes and other features. Of course, there can be other variations, modifications, and alternatives.

The above sequence of steps provides a method for fabricating a crystalline worm hole structure for photovoltaic applications according to an embodiment of the present invention. As shown, the method uses a combination of steps including a way of forming the crystalline material, which will be detached according to a specific embodiment. Other alternatives can also be provided where steps are added, one or more steps are removed, or one or more steps are provided in a different sequence without departing from the scope of the claims herein. Alternative methods according to specific embodiments can be found throughout the present specification and more particularly below.

METHOD EMBODIMENT USING PASSIVATION

In a specific embodiment, the present invention provides a method for fabricating a photovoltaic device that can be outlined as follows:

1. Provide a semiconductor substrate, e.g., single crystal silicon, silicon germanium, Group II/VI, Group III/V materials;
2. Form a crystalline material characterized by a plurality of worm hole structures therein overlying the semiconductor substrate
3. Subject the crystalline material to a hydrogen plasma species to occupy at least one or more of the worm hole structures therein of the crystalline material within a vicinity of an interface between the thickness of material and a remaining portion of the semiconductor substrate to form a cleave region;
4. Form a passivation layer overlying internal surface regions of the worm hole structures;
5. Provide a glue layer overlying a surface region of the crystalline material;
6. Join the surface region of the crystalline material via the glue layer to a support substrate;
7. Delaminate a portion of the crystalline material from the semiconductor substrate;
8. Maintain attachment of the portion of the thickness of crystalline material to the support substrate during step (7);
9. Cause formation of a textured surface region from the portion of the thickness of crystalline material;
10. Use the overlying thickness of crystalline material having the plurality of worm hole structures on the support substrate for a photovoltaic application;
11. Perform other steps, as desired.

The above sequence of steps provides a method for fabricating a crystalline worm hole structure for photovoltaic applications according to an embodiment of the present invention. As shown, the method uses a combination of steps including a way of forming the crystalline material, which will be detached according to a specific embodiment. In a preferred embodiment, the method also forms a passivation on internal surfaces of the worm hole structures. Other alternatives can also be provided where steps are added, one or more steps are removed, or one or more steps are provided in a different sequence without departing from the scope of the claims herein. Further details of the present method can be found throughout the present specification and more particularly below.

FIGS. 8 through 13 are simplified diagrams illustrating a method for fabricating a photovoltaic material according to an embodiment of the present invention. These diagrams are merely examples, which should not unduly limit the scope of the claims herein. One of ordinary skill in the art would recognize many variations, modifications, and alternatives. In a specific embodiment, the present invention provides a method for fabricating a photovoltaic material. The method includes providing a semiconductor substrate 800. As an example, the material can be single crystal silicon, silicon germanium, gallium arsenide, Group II/VI, or Group III/V materials. Alternatively, the material can be composites, layered, graded, or others, depending upon the specific embodiment. Of course, there can be other variations, modifications, and alternatives.

Figure 9:
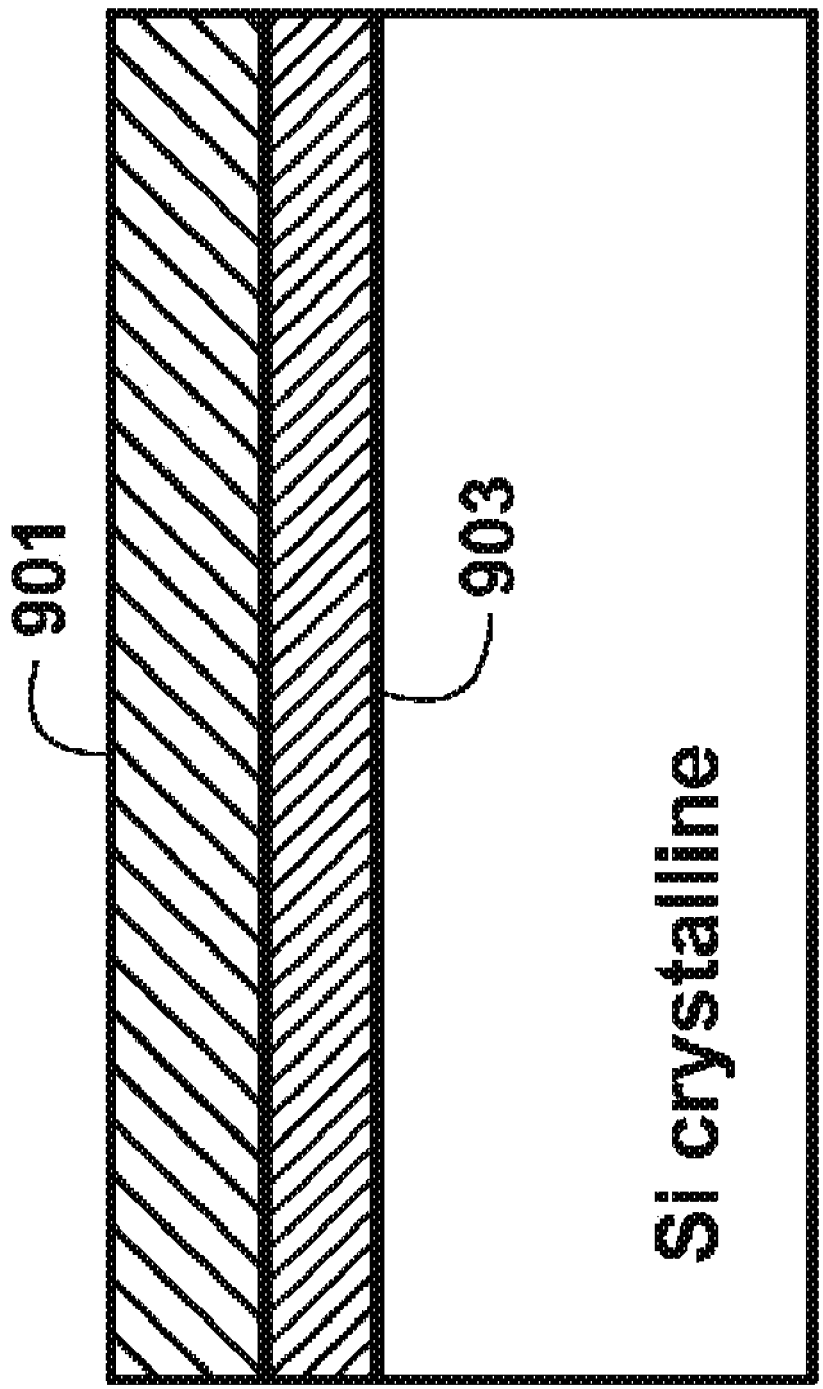

In a specific embodiment, the method includes forming a crystalline material characterized by a plurality of worm hole structures therein overlying the semiconductor substrate as illustrated in FIG. 9. In a specific embodiment, the method includes subjecting the surface region 801 of the semiconductor material to an electrochemical process to cause formation of a pores-per-volume density gradient ranging from a lower density at surface 901 to a higher density at interface region 903, which is a remaining portion of the semiconductor material. In a preferred embodiment, the semiconductor material is crystalline and/or like structure. Of course, there can be other variations, modifications, and alternatives.

As merely an example, the method uses an electrochemical etch process to cause formation of the worm hole structures. In a specific embodiment, the electrochemical etch processes uses an HF anodic attack chemistry. Such chemistry is provided using a bath of HF-containing solution according to a specific embodiment. A voltage of about tens of volts is provided between the crystalline material, which is used as a first electrode and a noble metal, which is a second electrode according to a specific embodiment. Pores per volume density of the wafer can be controlled by varying the applied current density. Switching the current density from high to low current enables the formation of a low-pore density surface and a high-pore density buried layer. The dimension of the pore, and therefore the pores per volume density, can also be controlled by varying the concentration of the HF-containing solution. Increasing the portion of HF in the solution results in smaller pore formations and higher pore densities. Alternatively, pore per volume density can further be controlled by the doping level of impurity inside the substrate material and the light illumination level during pore formation. Of course, there can be other variations, modifications, and alternatives.

In a specific embodiment, the worm hole structures are characterized by a density distribution from the surface region 901 of the crystalline material to a defined depth 903 within a z-direction of the surface region to form a thickness of material to be detached. In a specific embodiment, the worm hole structures are characterized by a density distribution. In a specific embodiment, the worm hole pore density is lower near the surface region than at the interface region. Of course, there can be variations, modifications, and alternatives.

As merely an example, the worm hole structures can have one or more dimension characteristics. That is, the hole structures comprise a characteristic dimension ranging from about 1 nanometer to about 1 micron according to embodiments of the present invention. Additionally, the density distribution ranges from about $10/cm^3$ to about $10^{20}/cm^3$ according to embodiments of the present invention. Of course, there can be variations, modifications, and alternatives.

Figure 10:
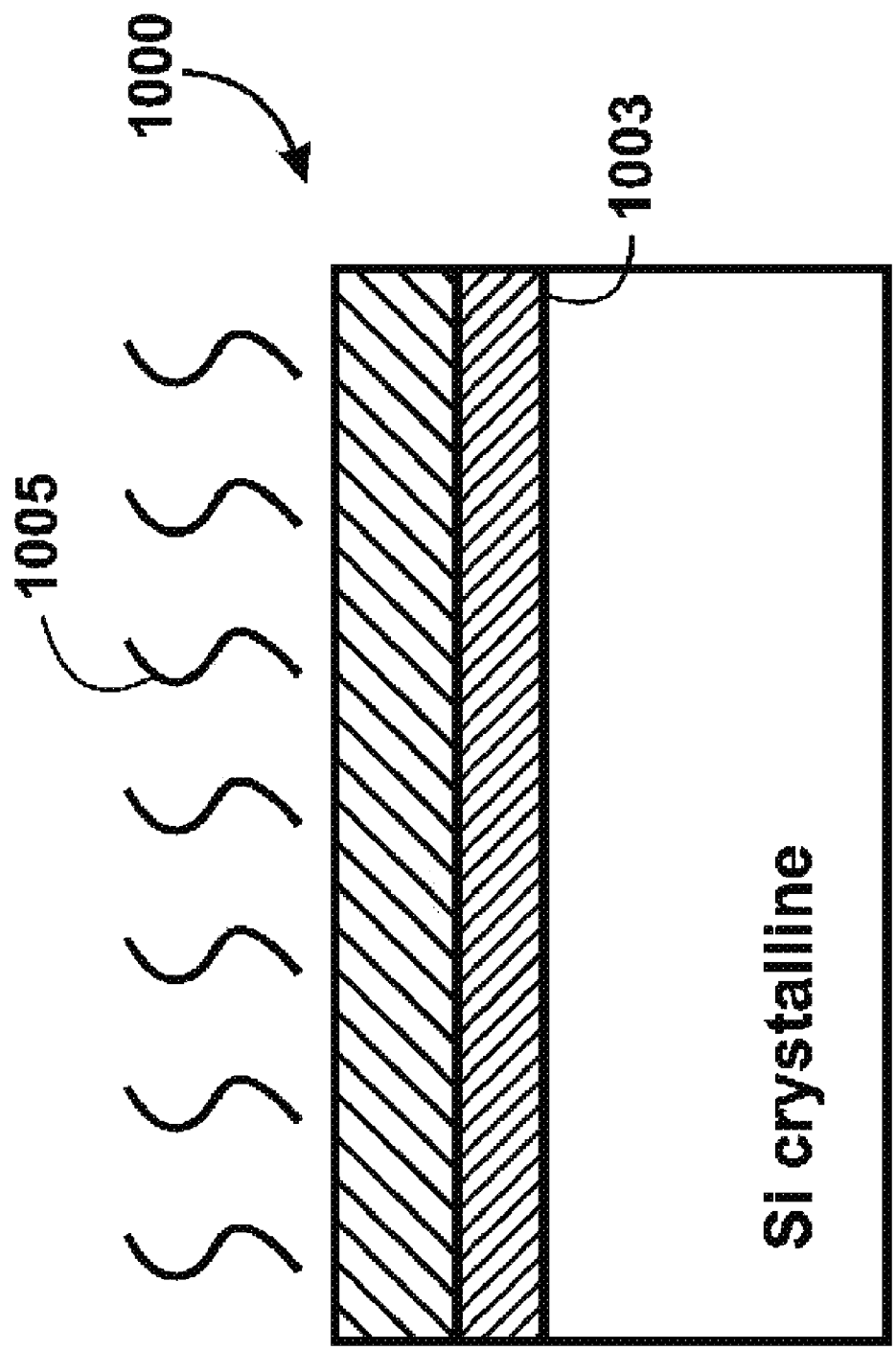

In a specific embodiment, the method includes subjecting 1000 the crystalline material to a hydrogen plasma species as illustrated by FIG. 10. Such plasma treatment can be used to occupy at least one or more of the worm hole structures therein of the crystalline material within a vicinity of an interface between the thickness of material and a remaining portion of the semiconductor substrate according to a specific embodiment. A higher concentration of hydrogen species accumulates at region 1003, which has a higher pores per volume density according to a specific embodiment. In a specific embodiment, the accumulation of hydrogen can range from a concentration of about $10^{18}/cm^3$ to about $10^{22}/cm^3$. In a preferred embodiment, the hydrogen concentration is about $10^{21}/cm^3$ and greater to add stress within region 1003, which serves as a cleave region. Of course, there can be other variations, modifications, and alternatives.

As also shown, the method includes passivating 1005 one or more internal surface regions of the worm hole structure according to an embodiment of the present invention. In a specific embodiment, the passivating can occur using hydrogen treatment or other treatment process, which can occur during any one of these processes or others. In a preferred embodiment, the internal surface structures have a passivation material overlying the surface regions to cause a reduction of a electron-hole recombination process. In a specific embodiment, the crystalline material is single crystal silicon. Such single crystal silicon includes silicon molecules. Such molecules may be terminated using hydrogen or other species according to a specific embodiment. In a preferred embodiment, the termination causes passivation of the internal surfaces of the worm hole structures, which lead to a reduction of electron-hole recombination or other influences. In other embodiments, other species can be used to passivate the surface region of the worm hole structures. Of course, there can be other variations, modifications, and alternatives.

Figure 11:
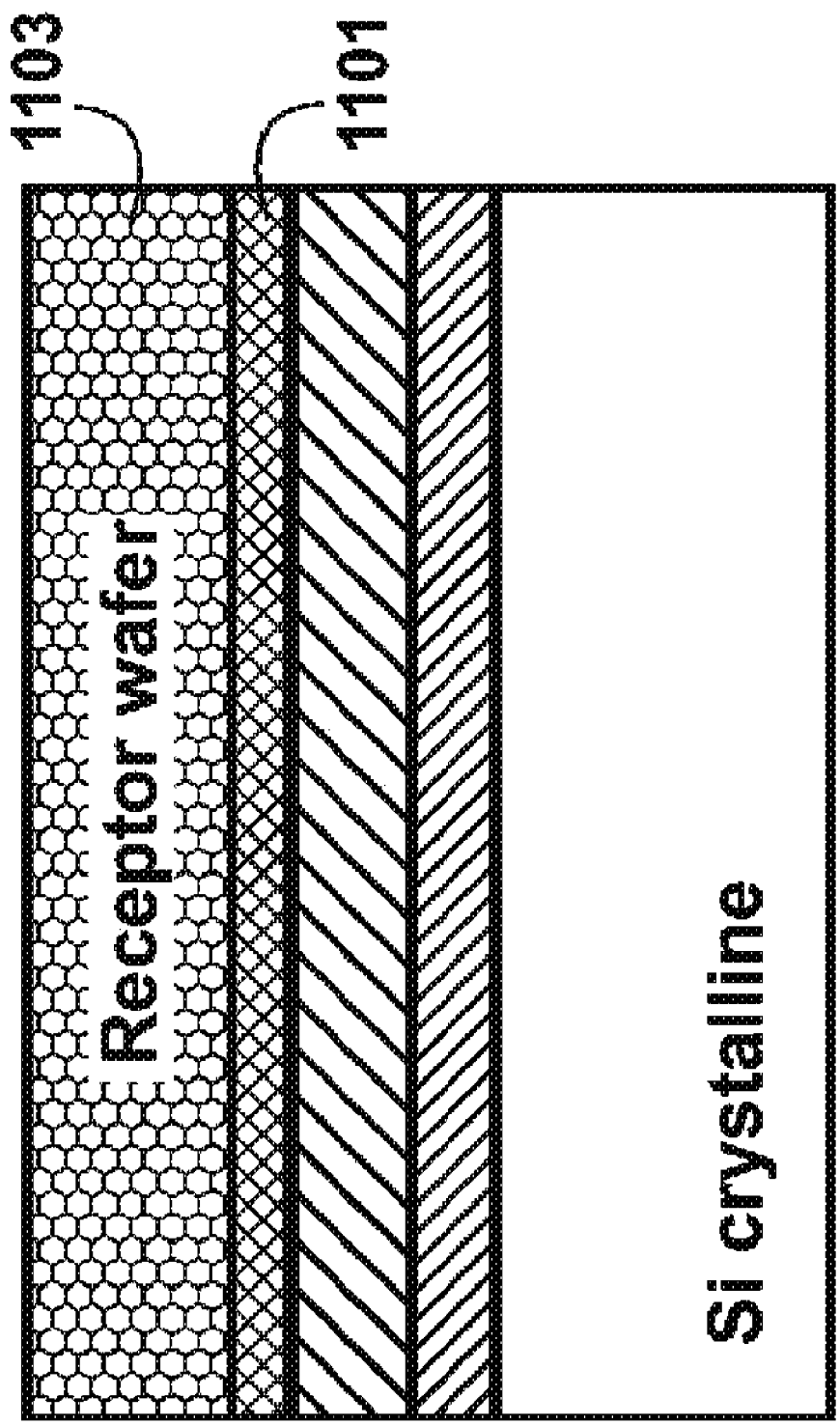

Referring to FIG. 11, the method includes providing a glue layer 1101 overlying a surface region of the crystalline material. Depending upon the embodiment, the glue layer can be provided on a support member 1103 or surface region of crystalline material. In a specific embodiment, the glue layer is selected from spin on glass, a eutectic material, a polymer, or a metal layer. In a specific embodiment, the spin on glass is silicate or polysiloxane material, but can be others. In a specific embodiment, the eutectic material alloys are aluminum-silicon and indium-palladium. In a specific embodiment, the polymer can be epoxy, which is organic in characteristic. Alternatively, the metal layer can be tungsten, tin or aluminum. Of course, there can be other variations, modifications, and alternatives.

In a specific embodiment, the method joins the surface region of the crystalline material via the glue layer to a support substrate 1103. In a specific embodiment, the support substrate can be a metal, dielectric, or semiconductor, or any combination of these. The support substrate can also be an organic polymer material, composite, or other structural entity according to a specific embodiment. As merely an example, the metal can be stainless steel, aluminum, molydenum, titanium, or silicides, including oxides of these metals. As merely an example, the dielectric material can be glass, quartz, organic polymer, or ceramics. As merely an example, the semiconductor can be silicon, including amorphous silicon, polysilicon, metallurgical silicon, and other forms of silicon. Of course, there can be other variations, modifications, and alternatives.

Figure 12:
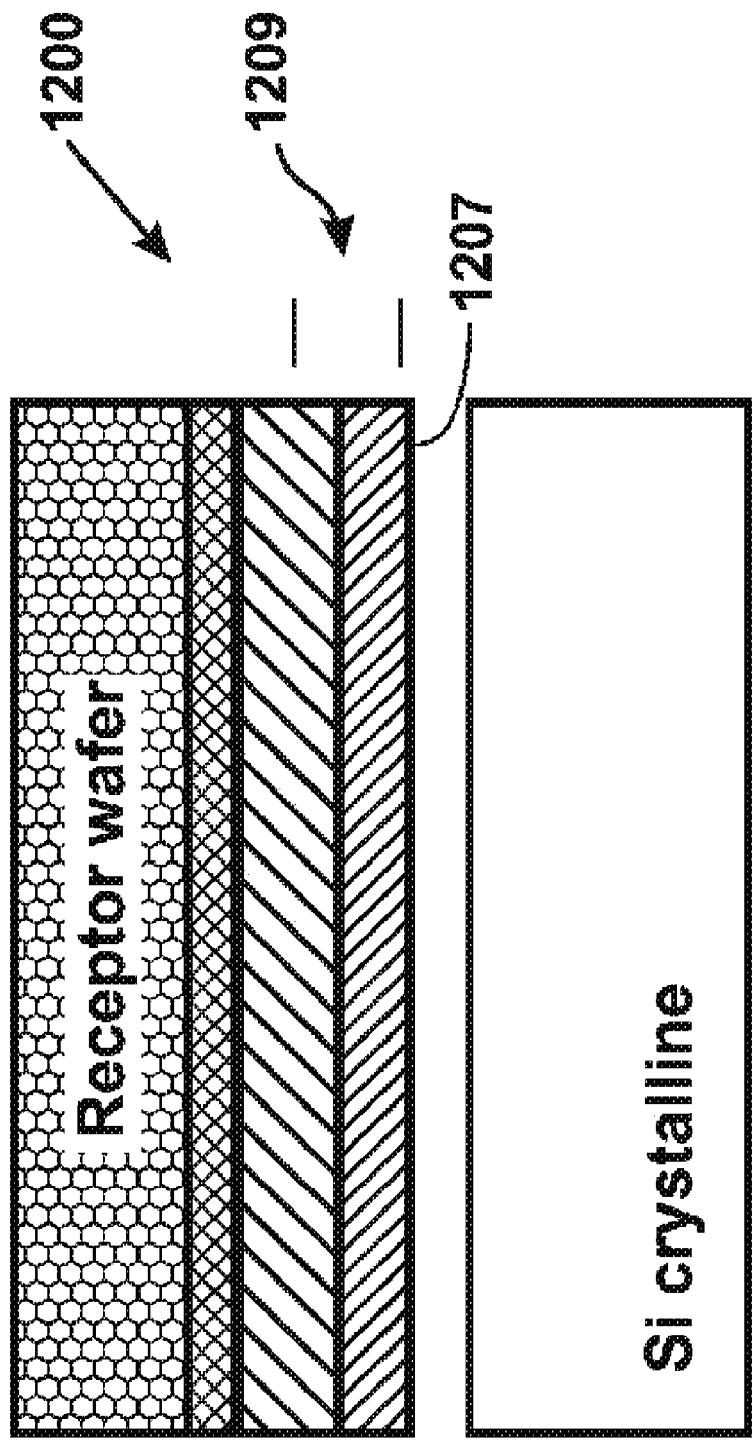

In a preferred embodiment, the method includes delaminating 1200 a portion of the crystalline material from the semiconductor substrate as illustrated in FIG. 12. In a specific embodiment, delamination occurs using thermal, chemical, mechanical, gravitational, electromagnetic, or other energy sources, including combinations of such sources. In a preferred embodiment, delamination occurs using thermal treatment by subjecting the bonded structure from 200 to 500 degrees Celsius for a period from 10 to 100 minutes to cause release at the cleave region from the remaining substrate portion, as shown. As shown, the delamination occurs while the portion of the thickness of crystalline material remains attached to the support substrate, to cause formation of a textured surface region from the portion of the thickness of crystalline material. Of course, there can be other variations, modifications, and alternatives.

As also shown, the method includes passivating 1209 one or more internal surface regions of the worm hole structure according to an embodiment of the present invention. In a specific embodiment, the passivating can occur using hydrogen treatment or other treatment process, which can occur during any one of these processes or others. Of course, there can be other variations, modifications, and alternatives.

In a specific embodiment, a textured surface region 1207 is formed from a detached surface region of the thickness of crystalline material. In a specific embodiment, the textured surface region has a roughness ranging from about 100 nanometers to about 10 microns. Depending upon the embodiment, the textured surface region is characterized by a surface roughness to facilitate capture of one or more photons being illuminated thereon. In other words, the textured surface region has a surface roughness of greater than about 100 nanometers to cause less than about 25% reflection from a total amount of irradiating in a wavelength ranging from about 0.1 micron to about 5 microns. Of course, there can be other variations, modifications, and alternatives.

Figure 13:
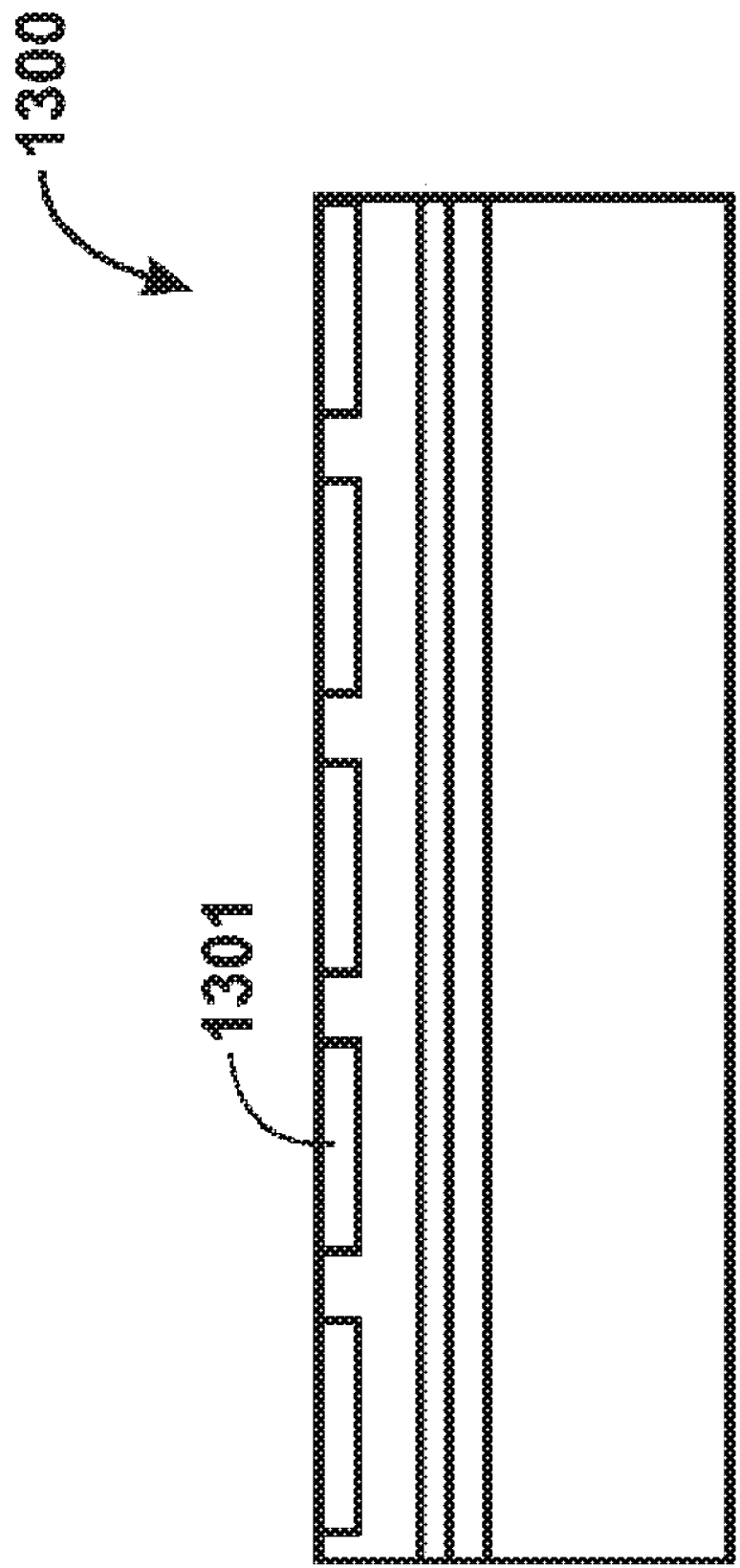

Referring to FIG. 13, the method includes using the overlying thickness of crystalline material having the plurality of worm hole structures on the support substrate for a photovoltaic application according to a specific embodiment. In a specific embodiment, the method includes forming one or more photovoltaic devices 1301 on a portion of the crystalline material. Depending upon the embodiment, such devices can be formed using implantation/diffusion and other techniques for introducing impurities into the crystalline material. In a preferred embodiment, the device also includes metallization for electrodes and other features. Of course, there can be other variations, modifications, and alternatives.

Although the above has been described in terms of specific embodiments, variations, alternatives, and modifications can exist. As an example, the cleave region should be mechanically weak, to delaminate and/or rip the cleave region up mechanically. There should be some processing using an adhesive and/or to facilitate bonding between the porous region and/or support substrate member. In a specific embodiment, the glue layer can be spin on glass (liquid binder), metal, etc, and the like and stay away from direct bonding. In a specific embodiment, the glue layer can be partially absorbed into the porous layer. The glue layer can be sprayed, coated, painted, etc. Of course, there can be other variations, modifications, and alternatives.

Experiments:

To prove the principles and operation of the present invention, we performed experiments. As will be appreciated, these experiments are merely examples and should not unduly limit the scope of the claims herein. One of ordinary skill in the art would recognize other variations, modifications, and alternatives. In these experiments, we used silicon wafers to fabricate porous silicon structures having a predefined thickness. In our experiments, we used a specific ratio of the following chemicals including: hydrofluoric acid; (49% by weight): ethanol (100%), water (DI water) (1:1:2) to facilitate forming the porous region according to a specific embodiment. A final HF concentration is about 13 percent by weight, but can be slightly higher or lower depending upon the embodiment. Of course, the concentration of the HF can vary highly to cause formation of different pore sizes, shapes, and distribution according to other embodiments.

Figure 14:
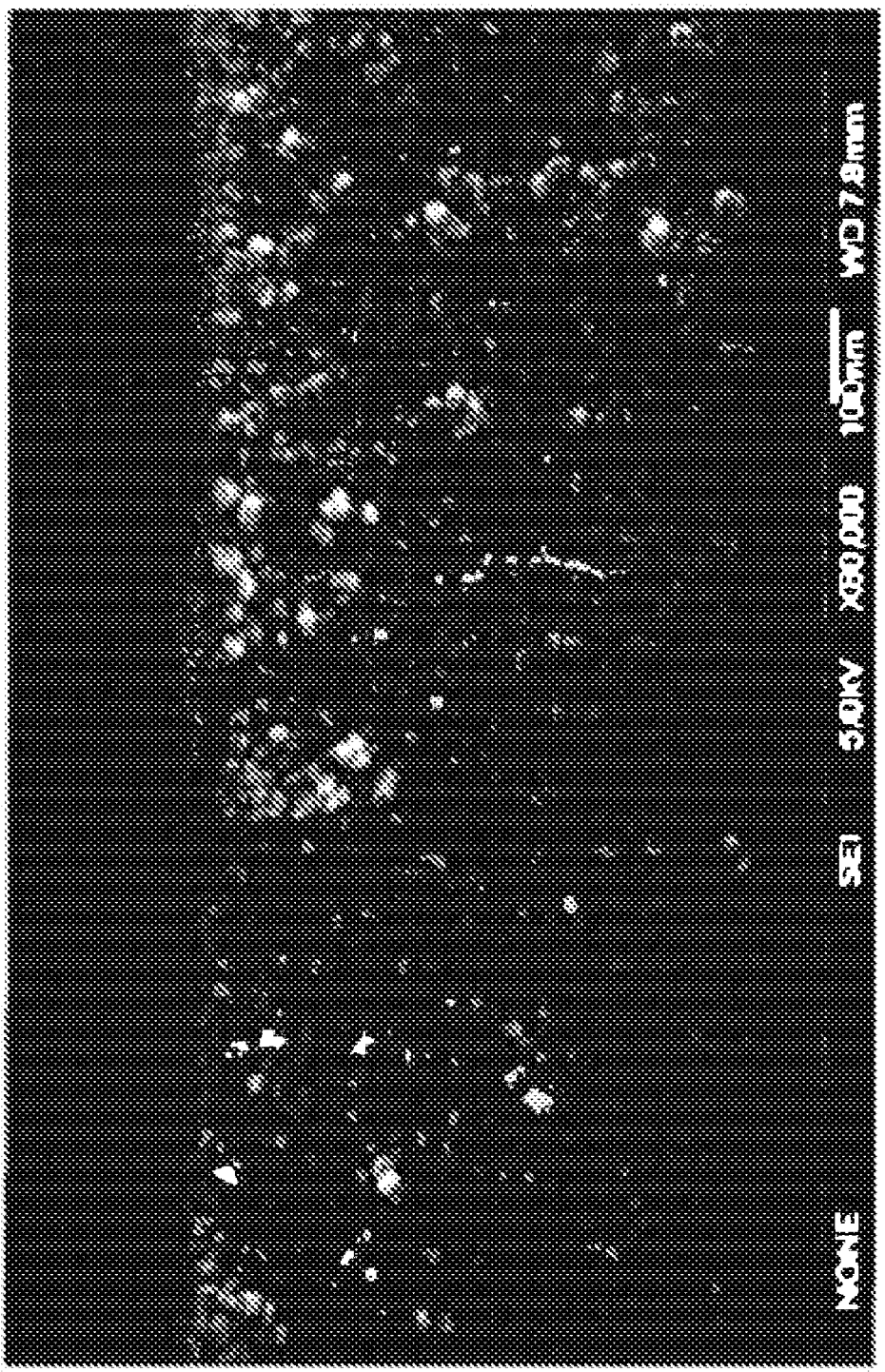
FIG. 14 is a SEM photograph of a porous silicon structure according to an embodiment of the present invention.

The silicon wafers, which were P-type, having a (100) orientation and a resistivity of about 20 Ohms/centimeter, but other types of wafers can also be used. The wafers were subjected to cleaning using a conventional RCA clean. The RCA clean removes organic contaminants from the surfaces of the wafers. Other types of cleaning techniques can also be used. In a specific embodiment, we used a bath having an electrochemical setup. The wafers served as anode, while cathode was platinum members immersed in the bath. In the experiment, the surface region of the wafer was exposed and the backside region has been protected using Teflon™ material. A voltage potential of about 10 volts was applied, although other variations of voltage and current can be applied. The current density on the surface of the wafer was about 2 mA/centimeter square. Of course, there can be other variations, modifications, and alternatives. For uniformity, we applied mechanical movement to the bath. The mechanical movement was performed using a magnetic stirring member, which created a constantly stirred environment. Other types of movement, including megasonic, ultrasonic, and the like can also be used. For this experiment, we subjected the wafers with the current for about 10 minutes to form about 1 micron of porous crystalline material, which has been shown in FIG. 14. As shown, we achieved forming the porous crystalline material according to a specific embodiment. Of course, there can be other variations, modifications, and alternatives.

In yet another experiments, we used a specific ratio of the following chemicals including: hydrofluoric acid; (49% by weight):ethanol (100%) (1:1) to facilitate forming two porous regions according to another specific embodiment. A final HF concentration is about 25 percent by weight, but can be slightly higher or lower depending upon the embodiment. Of course, the concentration of the HF can vary highly to cause formation of different pore sizes, shapes, and distribution according to other embodiments.

Figure 15:
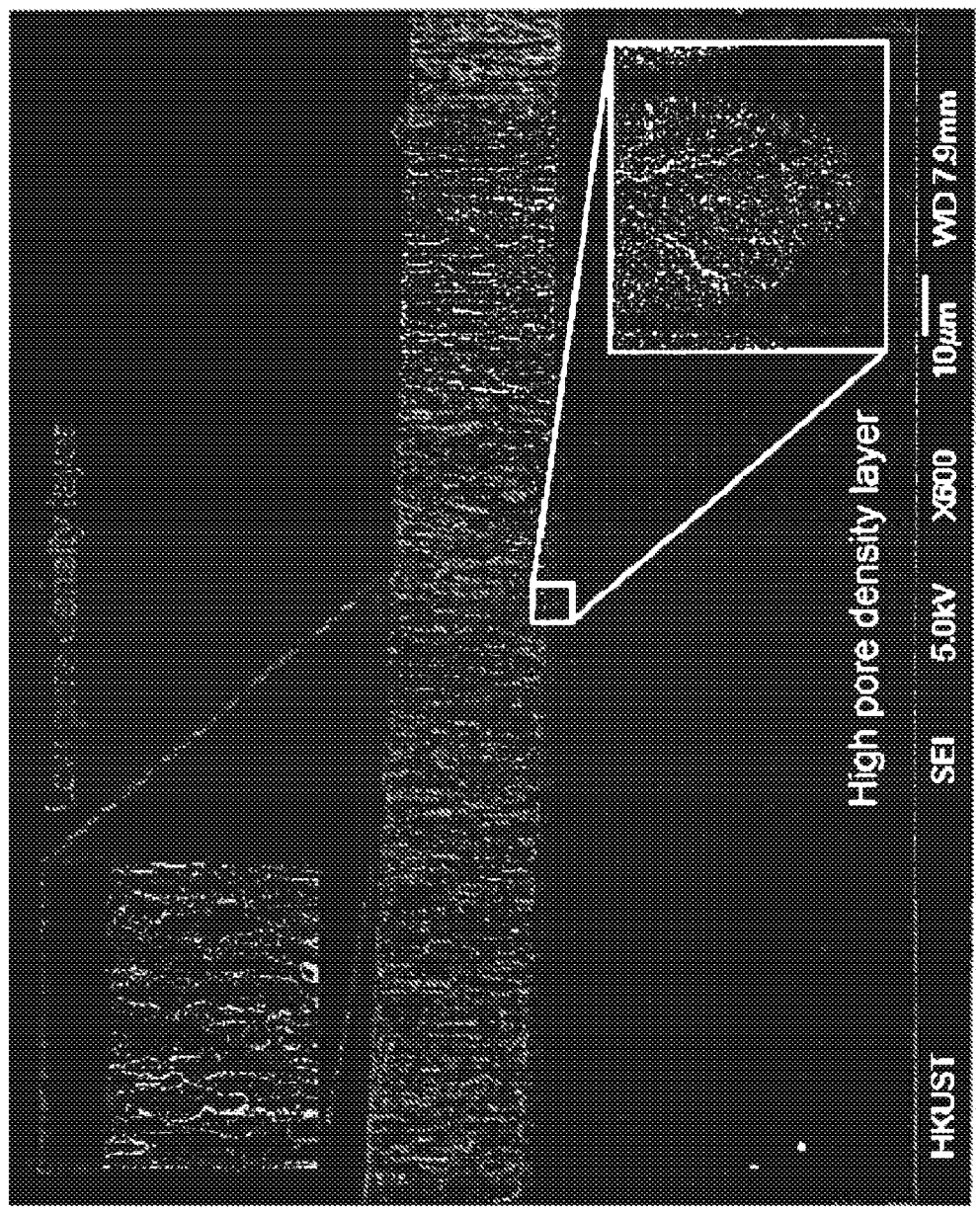
FIG. 15 is a SEM photograph of a double layer porous silicon structure of different pores per volume densities according to an embodiment of the present invention.

The silicon wafers, which were P-type, having a (100) orientation and a resistivity of about 20 Ohms/centimeter, but other types of wafers can also be used. The wafers were subjected to cleaning using a conventional RCA clean. The RCA clean removes organic contaminants from the surfaces of the wafers. Other types of cleaning techniques can also be used. In a specific embodiment, we used a bath having an electrochemical setup. The wafers served as anode, while cathode was platinum members immersed in the bath. In the experiment, the surface region of the wafer was exposed and the backside region has been protected using Teflon™ material. A constant current density of about 20 mA/cm$^2$ was flowed for 20 minutes, followed by another weaker current flow of about 2 mA/cm$^2$ for another 20 minutes, although other variations of voltage and current can be applied for other durations. Of course, there can also be other variations, modifications, and alternatives. For uniformity, we applied mechanical movement to the bath. The mechanical movement was performed using a magnetic stirring member, which created a constantly stirred environment. Other types of movement, including megasonic, ultrasonic, and the like can also be used. For this experiment, double layer porous crystalline material, with different pores per volume densities as shown in FIG. 15, has been obtained, although multiple layer porous crystalline materials can also be generated. As shown, we achieved forming the porous crystalline material with different pores per volume densities according to a specific embodiment. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a photovoltaic material, the method comprising: providing a semiconductor substrate; forming a first layer and a second layer of porous semiconductor crystalline material overlying the semiconductor substrate, both layers comprised of a plurality of wormhole structures, the wormhole structures being characterized by a density gradient from a surface region of the crystalline material to a defined depth within a z-direction of the surface region to form a thickness of material to be detached; wherein the density gradient of the wormhole structures in the first layer ranges from $10^{10}/cm^3$ to $10^{20}/cm^3$ and the density gradient of the wormhole structures in the second layer ranges from $10/cm^3$ to $10^{10}/cm^3$, wherein the first layer is in between the second layer and the semiconductor substrate; subjecting the porous semiconductor crystalline material to a hydrogen plasma species to occupy at least one or more of the wormhole structures of the semiconductor crystalline material within a vicinity of an interface between the thickness of material to be detached and a remaining portion of the semiconductor substrate; providing a glue layer overlying a surface region of the second layer of the porous semiconductor crystalline material; joining the surface region of the second layer of the semiconductor crystalline material via the glue layer to a support; and delaminating a continuous portion of the porous semiconductor crystalline material from the semiconductor substrate while the surface region of the thickness of the semiconductor crystalline material remains joined to the support via the glue layer, to cause formation of a new textured surface region from a new surface of the porous semiconductor crystalline material formed during delamination to create an upper light-incident surface of a photovoltaic material on the support.

2. The method of claim 1 wherein the semiconductor substrate comprises silicon.

3. The method of claim 1 wherein the semiconductor substrate comprises single crystal silicon, silicon germanium, gallium arsenide, Group II/VI, or Group III/V materials.

4. The method of claim 1 wherein the forming of the semiconductor crystalline material characterized by the plurality of worm hole structures comprises electrochemical etching a portion of a thickness of the semiconductor substrate to form the thickness of material to be detached and to form the interface between the thickness of material and the remaining portion of the semiconductor substrate.

5. The method of claim 3 wherein the portion of the thickness is characterized by a single crystalline semiconductor material.

6. The method of claim 1 wherein the hydrogen plasma species comprises a plurality of hydrogen particles.

7. The method of claim 1 wherein the hydrogen plasma species is maintained in a chamber.

8. The method of claim 1 wherein the delaminating comprises subjecting the portion of the semiconductor crystalline material to a thermal treatment process.

9. The method of claim 1 wherein the delaminating comprises subjecting the portion of the semiconductor crystalline material to a mechanical prying process.

10. The method of claim 1 wherein the delaminating comprises subjecting the portion of the semiconductor crystalline material to electromagnetic radiation.

11. The method of claim 1 wherein the delaminating comprises subjecting the portion of the semiconductor crystalline material to a chemical process.

12. The method of claim 1 wherein the delaminating comprises subjecting the portion of the semiconductor crystalline material to an energy to cause the delaminating.

13. The method of claim 1 wherein the glue layer is selected from spin on glass, a eutectic material, a polymer, or a metal layer.

14. The method of claim 1 wherein the worm hole structures comprise a characteristic dimension ranging from about 1 nanometer to about 1 micron.

15. The method of claim 1 wherein the textured surface region has a roughness ranging from about 10 nanometers to about 10 microns.

16. The method of claim 1 wherein the textured surface region is characterized by a surface roughness to facilitate capture of one or more photons being illuminated thereon.

17. The method of claim 1 wherein the textured surface region has a surface roughness of greater than about 10 nanometers to cause less than about 25% reflection from a total amount of irradiating in a wavelength ranging from about 0.1 micron to about 5 microns.

18. The method of claim 1 further comprising forming one or more P type and N type junctions on a portion of the semiconductor crystalline material.

19. A method for fabricating a photovoltaic material, the method comprising: providing a semiconductor substrate; forming a first layer and a second layer of porous semiconductor crystalline material overlying the semiconductor substrate, both layers comprised of a plurality of wormhole structures, the wormhole structures being characterized by a density gradient from a surface region of the crystalline material to a defined depth within a z-direction of the surface region to form a thickness of material to be detached; wherein the density gradient of the wormhole structures in the first layer ranges from $10^{10}/cm^3$ to $10^{20}/cm^3$ and the density gradient of the wormhole structures in the second layer ranges from $10/cm^3$ to $10^{10}/cm^3$, wherein the first layer is in between the second layer and the semiconductor substrate; subjecting the porous semiconductor crystalline material to a hydrogen plasma species to occupy at least one or more of the wormhole structures of the semiconductor crystalline material within a vicinity of an interface between the thickness of material to be detached and a remaining portion of the semiconductor substrate, the one or more wormhole structures having respective surface regions; passivating the wormhole structure surface regions during the subjecting of the hydrogen plasma species to reduce an electron-hole recombination process; providing a glue layer overlying a surface region of the second layer of the semiconductor crystalline material; joining the surface region of the second layer of the semiconductor crystalline material via the glue layer to a support; and delaminating a continuous portion of the porous semiconductor crystalline material from the semiconductor substrate while the surface region of the second layer of the semiconductor crystalline material remains joined to the support via the glue layer, to cause formation of a new textured surface region from a new surface of the semiconductor crystalline material formed during delamination to create an upper light-incident surface of a photovoltaic material on the support.

20. The method of claim 19 wherein the semiconductor substrate comprises silicon.

21. The method of claim 19 wherein the semiconductor substrate comprises single crystal silicon, silicon germanium, gallium arsenide, Group II/VI, or Group III/IV materials.

22. The method of claim 19 wherein the forming of the semiconductor crystalline material characterized by the plurality of worm hole structures comprises anodizing a portion of a thickness of the semiconductor substrate to form the thickness of material to be detached and to form the interface between the thickness of material and the remaining portion of the semiconductor substrate.

23. The method of claim 22 wherein the portion of the thickness is characterized by a single crystalline semiconductor material.

24. The method of claim 19 wherein the hydrogen plasma species comprises a plurality of hydrogen particles.

25. The method of claim 19 wherein the hydrogen plasma species is maintained in a chamber.

26. The method of claim 19 wherein the delaminating comprises subjecting the portion of the semiconductor crystalline material to a thermal treatment process.

27. The method of claim 19 wherein the delaminating comprises subjecting the portion of the semiconductor crystalline material to a mechanical prying process.

28. The method of claim 19 wherein the delaminating comprises subjecting the portion of the semiconductor crystalline material to electromagnetic radiation.

29. The method of claim 19 wherein the delaminating comprises subjecting the portion of the semiconductor crystalline material to a chemical process.

30. The method of claim 19 wherein the delaminating comprises subjecting the portion of the semiconductor crystalline material to an energy to cause the delaminating.

31. The method of claim 19 wherein the glue layer is selected from spin on glass, a eutectic material, a polymer, or a metal layer.

32. The method of claim 19 wherein the worm hole structures comprise a characteristic dimension ranging from about 1 nanometer to about 1 micron.

33. The method of claim 19 wherein the textured surface region has a roughness ranging from about 10 nanometers to about 10 microns.

34. The method of claim 19 wherein the textured surface region is characterized by a surface roughness to facilitate capture of one or more photons being illuminated thereon.

35. The method of claim 19 wherein the textured surface region has a surface roughness of greater than about 10 nanometers to cause less than about 25% reflection from a total amount of irradiating in a wavelength ranging from about 0.1 micron to about 5 microns.

36. The method of claim 19 further comprising forming one or more P type and N type junctions on a portion of the semiconductor crystalline material.

\* \* \* \* \*